United States Patent
Walker et al.

(10) Patent No.: US 6,407,926 B1
(45) Date of Patent: Jun. 18, 2002

(54) APPARATUS FOR MOUNTING ELECTRONIC CIRCUITS IN ELECTRIC POWER EQUIPMENT ENCLOSURES

(75) Inventors: Steven Dale Walker, Etewah; Reid Kimel Hartman; Charles Richard Mummert, both of Hendersonville; Charles Allan Morse, Arden; Irving Albert Gibbs, Fletcher; Rolando Fulgencio Martinez, Arden, all of NC (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 09/664,181

(22) Filed: Sep. 18, 2000

(51) Int. Cl.$^7$ .............................. H05K 5/00; H05K 7/14
(52) U.S. Cl. ...................... 361/752; 361/690; 361/801; 361/802; 211/41.17; 211/41.18; 439/377
(58) Field of Search ............................ 439/61, 64, 630, 439/631, 632, 634, 296, 310, 297, 79, 377, 629, 327; 174/250–254; 361/728–818; 211/41.11–41.18; 248/200–317

(56) References Cited

U.S. PATENT DOCUMENTS 3,216,580 A * 11/1965 Fricker, Jr. ............... 211/41.17
6,053,760 A * 4/2000 Bailis ........................ 439/377
6,285,556 B1 * 9/2001 Guth ........................... 361/752

OTHER PUBLICATIONS

Farnell Components, "Boxes and Equipment Housing", pp. 50–52.

* cited by examiner

Primary Examiner—Jayprakash N. Gandhi
Assistant Examiner—Michael L. Lindinger
(74) Attorney, Agent, or Firm—Martin J. Moran

(57) ABSTRACT

A pair of circuit boards, or electrically insulative panel members on which the circuit boards are mounted, have side edges which slide into aligned longitudinally extending slots in a pair of facing, spaced apart cantilevered free sections of a pair of planar legs of a bracket secured to a panel in an electric power equipment enclosure. A terminal portion of one free section diverges outward to form a camming surface against which a complimentary camming surface on a rearward edge of a tab on the associated side edge of the panel member bears to spread the free section apart until the tab passes into the slot and the terminal portion snaps over the tab and engages a latching surface on the forward edge of the tab to latch the panel member to the bracket. The panel member is released by lifting the diverging terminal portion of the one free section to clear the latching surface and sliding the panel member out of the slots.

2 Claims, 4 Drawing Sheets

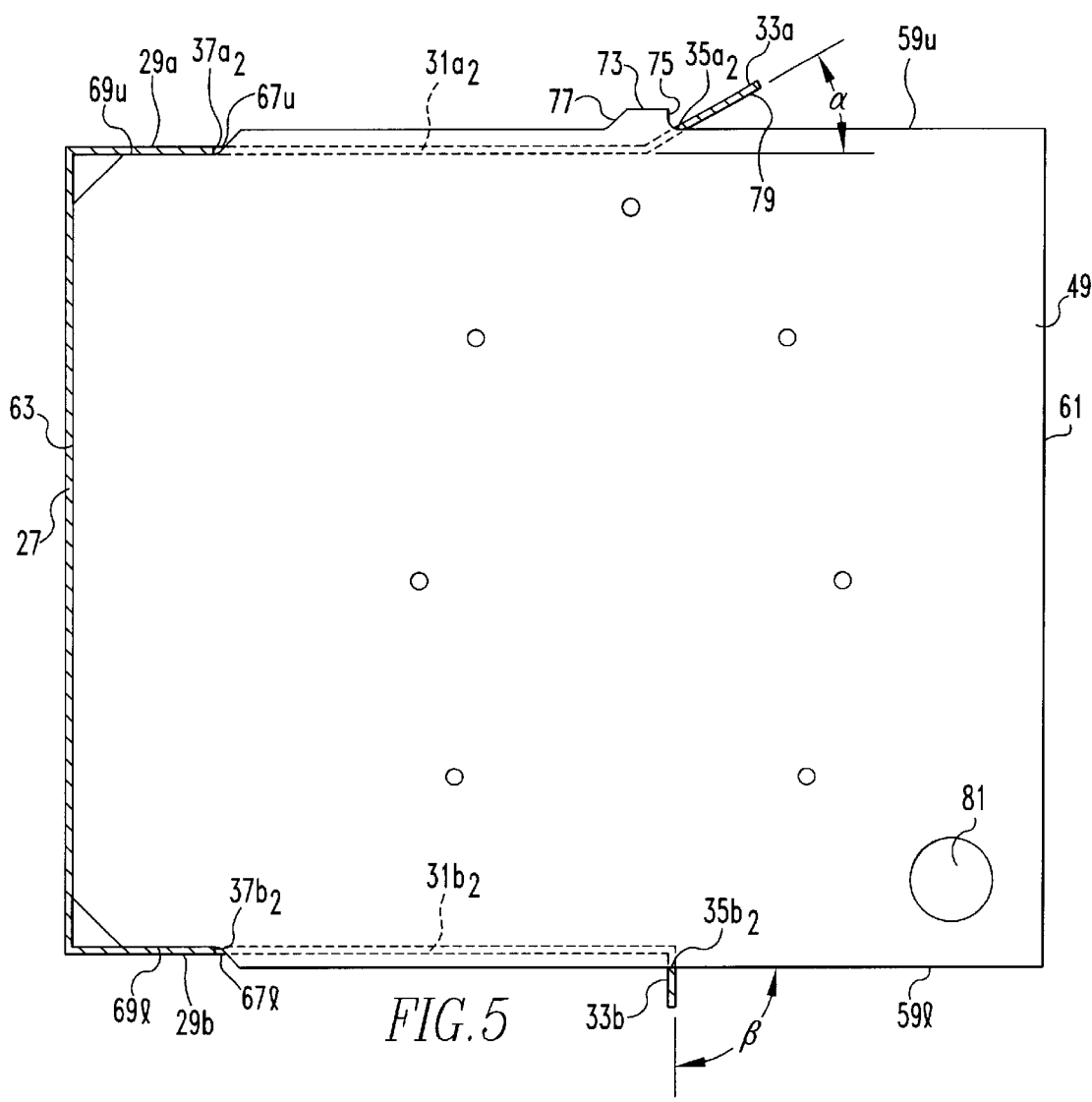
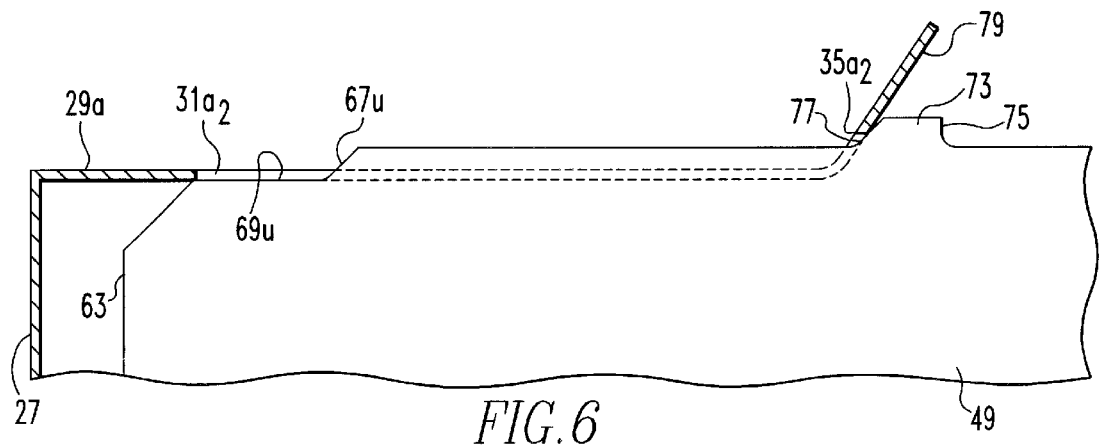

APPARATUS FOR MOUNTING ELECTRONIC CIRCUITS IN ELECTRIC POWER EQUIPMENT ENCLOSURES

BACKGROUND OF THE INVENTION

1. Field of the Invention

This invention relates to apparatus for mounting electronic circuits, and particularly electronic circuits implemented on circuit boards in the cabinets or enclosures of electric power equipment. More particularly, it relates to a snap-in and quick release edge mount for such circuit boards.

2. Background Information

Electronic circuits for electric power equipment are typically implemented on multiple circuit boards which are in turn mounted in a metal equipment cabinet or enclosure. Various arrangements have been utilized to mount the circuit boards. In smaller enclosures, the multiple circuit boards are stacked horizontally or vertically by sliding them into fixed slots formed along facing top and bottom or opposed side walls, respectively, in the enclosure and locking them in place such as by rotatable clamps or other locking devices. Such stacked (or piggy backed) mounting can make plugs on the boards for test equipment and related components inaccessible.

Electronic circuits for some electric power equipment, for instance exciters for large generators, operate at substantial voltages which must be isolated. A known arrangement for mounting the electronic circuit boards for such applications is shown in FIGS. 1 and 2. Two electronic circuits 1a and 1b are implemented on circuit boards 3a and 3b, respectively. The circuit boards 3a and 3b are secured in spaced parallel relation to electrically insulative mounting panels 5a and 5b by electrically isolated standoffs 7a and 7b.

Each of the mounting panels of 5a and 5b is secured to a panel 9 and an electrical equipment enclosure (not shown) by an L-bracket 11a and 11b, respectively. Each bracket 11a, 11b has a first flange 13 which is bolted to the panel 9 and a second flange 15 at right angles to the first flange and to which the associated mounting panel is secured.

Thus, the mounting panels 5a and 5b are cantilevered outward from the panel 9 by the L-brackets 11a and 11b. The electric circuits 1a and 1b are isolated from one another by mounting their respective circuit boards 3a and 3b on outward facing sides of the mounting panels. The standoffs 7a and 7b further increase the creep distance between the two circuits.

While the arrangement of FIGS. 1 and 2 provides easy accessibility to the electronic circuits and good electrical isolation for the substantial voltages in the circuits, there are some drawbacks. Vibrations caused by internal harmonics, transport or seismic activity increases the probability of failure or malfunction. While bracing 17 between the mounting panels stiffens the structure, there is still room for improvement.

There is a need therefor for an improved apparatus for mounting electronic circuits in electronic power equipment enclosures which provides a compact arrangement with ready access to, and adequate isolation for the elevated voltages in, the circuits while also providing suitable isolation from vibration.

There is a further need for such mounting apparatus which provides for easy installation and removal of the circuits, yet is simple, easily fabricated, and economical.

SUMMARY OF THE INVENTION

These needs and others are satisfied by the invention which is directed to a user-friendly, slide-in/slide-out, self-locking apparatus for mounting electronic circuits in electric power equipment enclosures. The apparatus includes a bracket comprising a pair of planar legs each having a base section and a free section compliantly cantilevered laterally outward from the base section. Each free section has at least one longitudinally extending slot, at least one of which, has a closed forward end. The bracket also includes mounts mounting the base sections of the pair of planar legs to the electrical power equipment enclosure with the free sections in spaced facing alignment and with the at least one longitudinal slot in each free section aligned. The apparatus further includes an electronic assembly comprising a planar member and an electronic circuit supported by the planar member. The planar member has opposite side edges spaced apart to spread the compliantly cantilevered free sections of the bracket apart and engage the at least one longitudinally extending slot in each free section. The planar member has a latching surface engaging the closed forward end in the one slot to releasably latch the planar member to the bracket with the opposite side edges of the planar members seated in the longitudinally extending slots in the free sections of the planar legs. The free sections of the planar legs are compliantly deflectable away from each other for unlatching and removal of the planar member.

Preferably, the base sections of the two planar members are integral to form a single piece bracket. Also preferably, one of the opposed edges of the planar member has a shoulder forming the latching surface.

The electronic circuits are implemented on a circuit board which can be the planar member which is slid into the slots in the bracket for direct mounting. However, in the most preferred form of the invention, the planar member is a separate, preferably electrically insulative member, and the circuit board is mounted on the panel member, preferably by electrically insulative standoff mounting members.

Two electronic assemblies can be mounted by a single bracket by providing a pair of longitudinally extending slots in the free sections of the pair of planar legs. Again, the circuit boards can be directly inserted into the slots, but preferably, insulative panel members supporting the circuit boards are secured in the pair of slots in the bracket. In this arrangement, the circuit boards can be mounted on the outwardly facing sides of the two panel members to provide additional isolation between the circuits.

The longitudinally extending slots in the free sections of the planar legs of the bracket can be through slots. In addition, the free sections can have divergent terminal sections in which the longitudinally extending through slots terminate to form support surfaces for the side edges of the planar member. At least one of the terminal sections can diverge at an acute angle to form a camming surface. The associated side edge of the panel member can have a complimentary camming surface which engages the camming surface on a divergent terminal supportion to spread the free sections apart as the panel member is inserted in the longitudinally extending slots. In a particularly advantageous arrangement, this side edge of the planar member can have a tab with the complimentary camming surface on a rearward facing edge of the tab and the latching surface for locking the panel member in the bracket on a forward edge of the tab.

The longitudinally extending slots in the free sections of the planar legs of the bracket can terminate short of the base sections. In this case the opposite side edges of the planar member have notches extending from a rear edge of the planar member to form an offset section of the side edge which seats on the free section of the planar leg between the longitudinally extending slot and the base section. These notches can be sized and the longitudinally extending slots can be positioned so that when the panel member is latched in the bracket, the rear edge of the panel member seats against the base sections of the planar legs.

BRIEF DESCRIPTION OF THE DRAWINGS

A full understanding of the invention can be gained from the following description of the preferred embodiments when read in conjunction with the accompanying drawings in which:

FIG. 5 is a vertical sectional view through the assembled apparatus.

FIG. 6 is a fragmentary view similar to FIG. 4 illustrating the camming action during insertion of the electronic assembly into the bracket of the apparatus.

DESCRIPTION OF THE PREFERRED EMBODIMENTS

Figure 1:
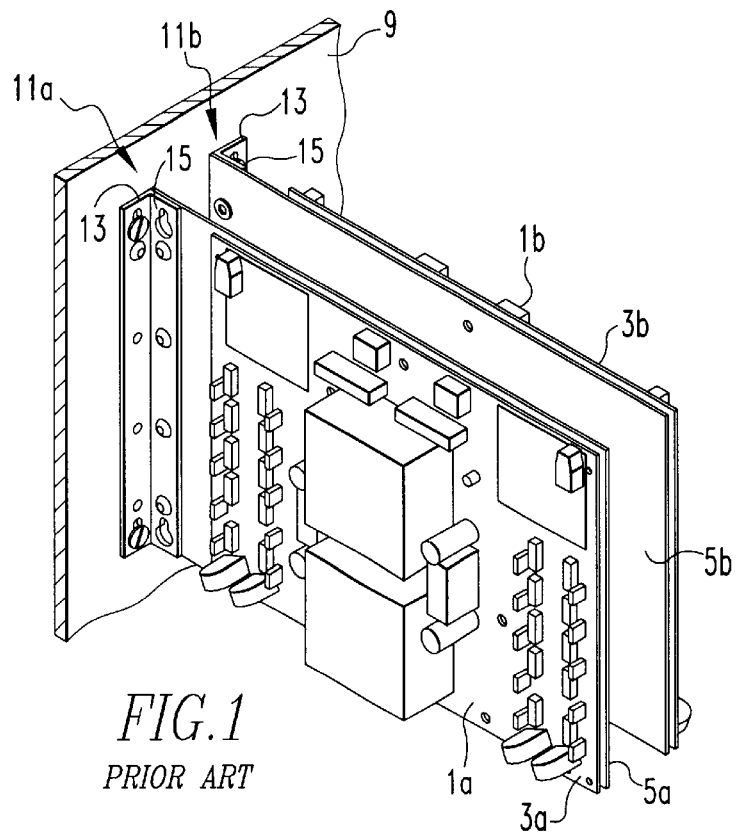
FIG. 1 is an isometric view of a prior art apparatus for mounting electronic circuits in an electric power equipment enclosure.
Figure 2:
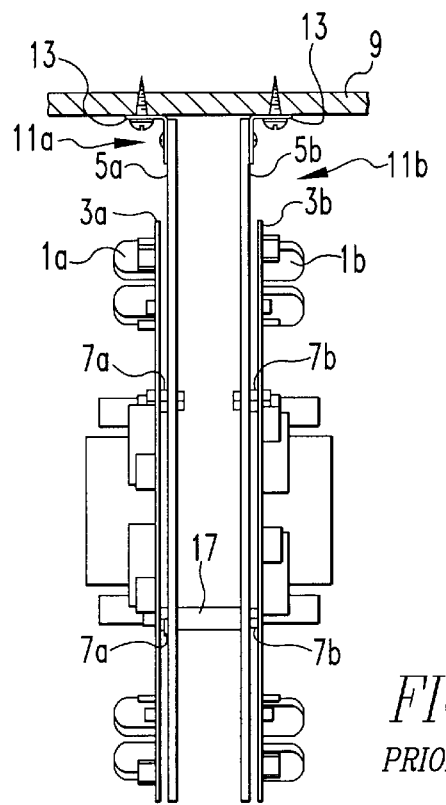
FIG. 2 is a top plan view of the arrangement of FIG. 1.
Figure 3:
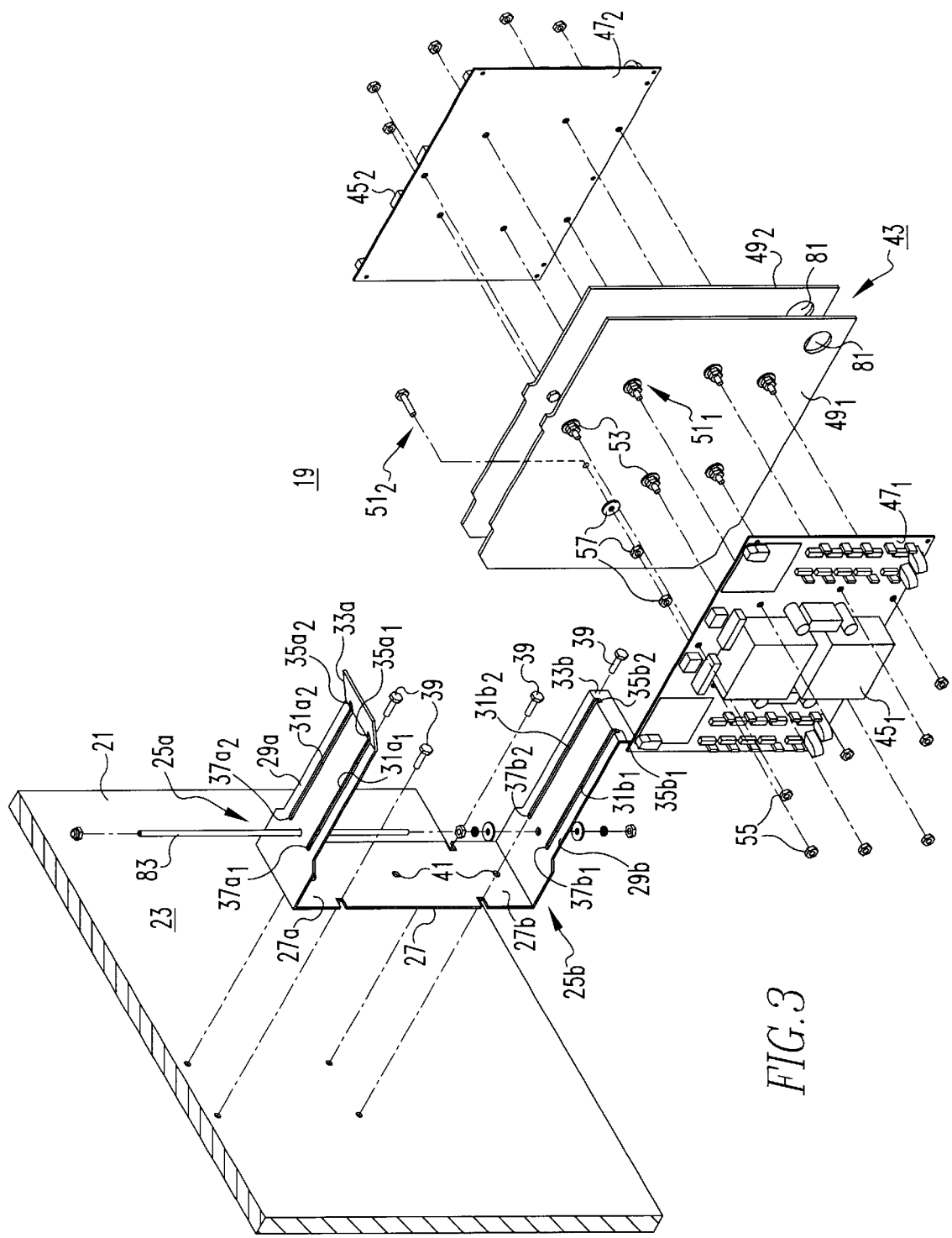
FIG. 3 is an exploded isometric view of apparatus in accordance with the invention.

Referring to FIG. 3, apparatus 19 mounts electronic circuits on a panel 21 of an electric power equipment enclosure. The apparatus 19 includes a bracket 23 which is formed by a pair of planar legs 25a and 25b each having a base section 27a and 27b and a free section 29a and 29b compliantly cantilevered laterally outward from the associated base sections 27a and 27b, respectively. Preferably, as shown, the base sections 27a and 27b are integrally formed to provide a common base 27 so that the bracket 23 is a single piece which can be fabricated from compliant sheet material such as cold rolled steel. Each free section 29a and 29b has a first longitudinally extending slot $31a_1$ and $31b_1$ and a second longitudinally extending slot $31a_2$ and $31b_2$. The corresponding slots in the two free sections are aligned. The free sections have terminal portions 33a and 33b which diverge. The terminal portion 33a diverges at an acute angle α (see FIG. 4) of about 30°, while the terminal portion 33b diverges at an angle β of about 90°. The slots 31 extend into these terminal portions and have closed forward ends $35a_1$, $35a_2$, $35b_1$, $35b_2$ which perform functions to be described. The slots 31 are through slots meaning that they extend all the way through the respective free sections 29a and 29b. The closed inner ends $37a_1$, $37a_2$, $37b_1$, $37b_2$ of the slots are spaced from the base section 27 by an amount, and for reasons to be discussed.

The bracket 23 is secured to the panel 9 by mounts in the form of fasteners such as screws 39 which pass through holes 41 in the base section 27. Thus, with the base 27 firmly secured to the panel 9, the free sections are cantilevered transversely outward from the panel in spaced facing relationship.

The apparatus 19 further includes an electronic assembly 43. This electronic assembly 43 includes first and second electronic circuits $45_1$ and $45_2$ each mounted on a circuit board $47_1$ and $47_2$, respectively. The circuit boards, which can be printed circuit boards, are in turn, mounted in spaced parallel relation on electrically insulative panel members $49_1$ and $49_2$ by electrically insulative mounting members $51_1$ and $51_2$ in the form of nylon bolts 53, nuts 55 and spacers 57.

Figure 4:
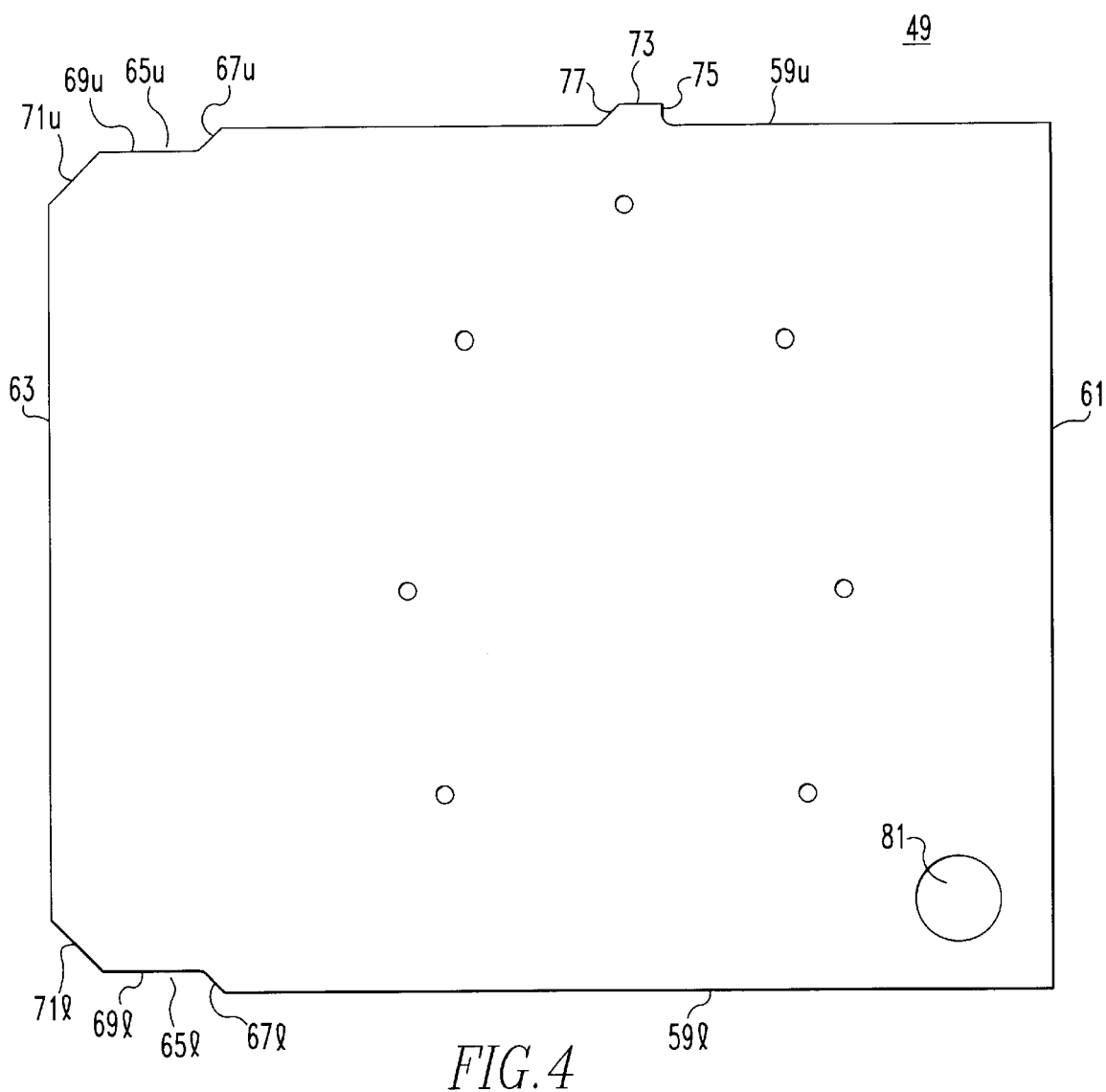
FIG. 4 is an elevation view of a mounting panel which forms part of the apparatus.

As best seen in FIG. 4, the planar members 49 have opposite side edges 59U and 59L, a front edge 61 and a rear edge 63. The opposite side edges 59U and 59L have notches 65U and 65L extending forward from the rear edge forming shoulders 67U and 67L and offset sections 69U and 69L of the respective side edges 59U and 59L. The rear corners of the panel member 49 are chamfered at 71U and 71L. A selected side edge, in this case the top side edge 59U of the panel member 49 has a tab 73 with a forward facing edge 75 which is generally perpendicular to the adjoining edge 59U, and a rearward facing edge 77 which is inclined with respect to the adjacent edge 59U.

Referring to FIGS. 5 and 6, the electronic assembly 43 is secured to the panel 9 by inserting the side edges 59U and 59L of mounting members $51_1$ and $51_2$ in the associated pair of longitudinally extending slots $31a_1$, $31b_1$ and $31a_2$, $31b_2$ in the free sections 29a and 29b, respectively. The panel members 49 are sized and the free sections 29a and 29b of the bracket 23 are sized so that the spacing between the free sections 29a and 29b is about equal to the distance between the offset sections 69U and 69L of the panel members. The free section 29b projects from the base 27 at about a 90° angle while the free section 29a converges at a slight angle such as about 89° to the base. Actually either or both of the free sections could converge slightly. Each panel member 49 is aligned with the associated pair of longitudinally extending slots $31a_1$ and $31b_1$ or $31a_2$ and $31b_2$. The chamfers 71U and 71L help to lead the panel member into the slots 31. As a panel member enters the slots, the free sections 29 are compliantly spread apart slightly to accommodate the panel member. The forward facing surface of the terminal portion 33a forms a camming surface 79. The rearward facing edge 77 of the tab 73 on the planar member 49 forms a complimentary camming surface which engages the camming surface 79 which deflects the free section 29a upward to allow the tab 73 to pass into the notch $31a_1$ or $31b_1$. As this tab 73 passes beyond the closed forward end 35a or 35b of the associated slot, the free section 29a compliantly snaps down along the latching surface formed by the forward facing edge 75 of the tab to lock the planar member 49 in the bracket 23. The closed forward ends 35a and 35b of the slots 31a and 31b form lateral support surfaces which bear against the side edges 59U and 59L, respectively.

As the planar member 49 becomes fully seated in the slots 31, the offset sections 69U and 69L of the side edges 59U, 59L pass beyond the closed rear ends $37a_1$, $37a_2$ or $37b_1$, $37b_2$ of the slots 31a or 31b and rest on the free sections 29a and 29b between the slots 31 and the base 27. The length of the notches 65U and 65L and the spacing of the closed inner ends 37a and 37b from the base 27 can be such that with the panel member 49 latched in the bracket 23, the rear edge 63 of the panel member seats against the base 27. A large opening 81 in the panels 49 can serve as a finger hole for grasping the panel.

It can be appreciated that, while the bracket 23 is shown mounted to the panel 9 so that the circuit boards $47_1$ and $47_2$ are supported in a vertical plane, it can be mounted at any angle including the horizontal. Furthermore, as can be appreciated, additional longitudinal slots 31 could be provided in the free sections 29a and 29b for receiving additional panel members 49 supporting electronic circuits 45. Obviously, in that instance, the free sections 29 would have to be made sufficiently wide to provide suitable spacing and isolation between the electronic circuits 45. In addition, an elongated member such as a tie rod 83 can be used to tie the free sections 29a and 29b of the planar legs 25a and 25b, as shown in FIG. 3, to provide stiffening.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. Apparatus for mounting electronic circuits in an electric power equipment enclosure, comprising:

a bracket comprising:

a pair of planar legs each having a base section and a free section having a pair of side-by-side longitudinally extending slots each of which has a close forward end;

mounts mounting the base sections of the pair of planar legs in the electrical power equipment enclosure with the free sections in spaced facing alignment and with the side-by-side longitudinal slots in one free section aligning with the corresponding side-by-side longitudinal slots in the other free section aligned; and an electronic assembly comprising first and second planar members, and a separate electronic circuit supported by each planar member, each planar member having opposite side edges spaced apart to spread the compliantly cantilevered free sections of the bracket apart and engage the longitudinally extending slots in each free section, the planar members each having a latching surface engaging the closed forward end of one of said side-by-side slots to releasably latch each planar member to the bracket with the opposite side edges of the planar member seated in the corresponding side-by-side longitudinally extending slots in the free sections of the other planar legs.

2. The apparatus of claim 1 wherein the first and second planar members are electrically insulative and the electronic assembly further includes first and second printed circuit boards carrying the first and second electronic circuits, respectively, and first and second electrically insulative mounting members mounting the first and second printed circuit boards in spaced relation on outwardly facing sides of the first and second planar members, respectively.

* * * * *